United States Patent
An et al.

(10) Patent No.: US 9,214,596 B2
(45) Date of Patent: Dec. 15, 2015

(54) COMPOUND SEMICONDUCTOR DEVICES AND METHODS FOR FABRICATING THE SAME

(75) Inventors: Sung-Jin An, Gyeongbuk (KR);
Dong-Gun Lee, Gyeongbuk (KR);
Seok-Han Kim, Daegu (KR)

(73) Assignees: LG Siltron Inc. (KR); Kumoh National Institute of Technology Industry-Academic Cooperation Foundation (KR)

( * ) Notice: Subject to any disclaimer, the term of this patent is extended or adjusted under 35 U.S.C. 154(b) by 149 days.

(21) Appl. No.: 13/880,708

(22) PCT Filed: Oct. 26, 2011

(86) PCT No.: PCT/KR2011/008019
§ 371 (c)(1),
(2), (4) Date: Apr. 19, 2013

(87) PCT Pub. No.: WO2012/057517
PCT Pub. Date: May 3, 2012

(65) Prior Publication Data
US 2013/0200424 A1  Aug. 8, 2013

(51) Int. Cl.
*H01L 33/02* (2010.01)
*H01L 21/02* (2006.01)
(Continued)

(52) U.S. Cl.
CPC ............ *H01L 33/02* (2013.01); *H01L 21/0237* (2013.01); *H01L 21/0254* (2013.01); *H01L 21/02104* (2013.01); *H01L 21/02439* (2013.01); *H01L 21/02444* (2013.01);
(Continued)

(58) Field of Classification Search
CPC ... H01L 33/02; H01L 21/02104; H01L 29/06; H01L 21/02499; H01L 21/36; H01L 21/02502; H01L 21/02488; H01L 21/02444; H01L 21/0237; H01L 21/02458; H01L 33/007; H01L 21/02439; H01L 21/0254; H01L 33/12; H01L 21/02378; H01L 21/02612; H01L 21/0262; H01L 33/0079; H01L 29/16; H01L 29/1606; H01L 29/2003; H01L 21/02631; B82Y 40/00; Y10S 977/734
See application file for complete search history.

(56) References Cited

U.S. PATENT DOCUMENTS

2010/0258787 A1*  10/2010  Chae et al. ............... 257/39
2010/0266964 A1   10/2010  Gilje

FOREIGN PATENT DOCUMENTS

JP  2003-078214  3/2003
JP  2008-277430  11/2008
(Continued)

OTHER PUBLICATIONS

Korean Office Action for KR 10-2010-0104552 mailed Jan. 26, 2010, best available copy provided.
PCT International Search Report for PCT/KR2011/008019 mailed May 24, 2012.
Japanese Application No. 2013-536510, Notice of Allowance dated Dec. 9, 2014 (best available copy, no English translation).

*Primary Examiner* — Ermias Woldegeorgis
(74) *Attorney, Agent, or Firm* — Lewis Roca Rothgerber LLP

(57) ABSTRACT

According to the present invention, a method for manufacturing a compound semiconductor comprises: forming a graphene-derived material layer on either a first selected substrate or a first selected compound semiconductor layer; forming a second compound semiconductor layer of at least one layer on at least said graphene-derived material layer, and changing the graphene-derived material layer so as to separate said second compound semiconductor layer of at least one layer.

20 Claims, 16 Drawing Sheets

(51) Int. Cl.
 *H01L 33/00* (2010.01)
 *H01L 33/12* (2010.01)
 *H01L 21/36* (2006.01)
 *H01L 29/06* (2006.01)
 *B82Y 40/00* (2011.01)

(52) U.S. Cl.
 CPC ... *H01L 21/02458* (2013.01); *H01L 21/02488* (2013.01); *H01L 21/02499* (2013.01); *H01L 21/02502* (2013.01); *H01L 21/36* (2013.01); *H01L 29/06* (2013.01); *H01L 33/007* (2013.01); *H01L 33/12* (2013.01); *B82Y 40/00* (2013.01); *Y10S 977/734* (2013.01)

(56) References Cited

FOREIGN PATENT DOCUMENTS

| | | |
|---|---|---|
| JP | 2009-302314 | 12/2009 |
| JP | 2010-232464 | 10/2010 |
| JP | 2011-009268 | 1/2011 |
| KR | 10-2004-0029165 | 4/2004 |
| KR | 10-2009-0059871 | 7/2009 |
| KR | 10-2010-0042122 | 4/2010 |
| KR | 10-2010-0055098 | 5/2010 |
| KR | 10-2010-0094908 | 8/2010 |
| WO | WO 2010/071633 | 6/2010 |

* cited by examiner

COMPOUND SEMICONDUCTOR DEVICES AND METHODS FOR FABRICATING THE SAME

CROSS-REFERENCE TO RELATED APPLICATIONS

The present application is a national phase application of PCT application PCT/KR2011/008019 filed Oct. 26, 2011, which claims the priority benefit of Korean patent application 10-2010-0104552 filed Oct. 26, 2010, the disclosures of which are incorporated herein by reference.

TECHNICAL FIELD

The present disclosure relates to a compound semiconductor device and a method for manufacturing the same.

BACKGROUND ART

A light emitting diode (LED) is a kind of a P-N junction diode and is a semiconductor device using an electroluminescence which is a monochromatic light emitting phenomenon when a voltage is applied to forward direction. The wavelength of the light emitted from the light emitting diode is determined by the badgap energy (Eg) of a material used. At the beginning of the light emitting diode technique, light emitting diodes capable of emitting infrared and red light have been developed. Researches on a blue LED has begun in full-scale after founding that a blue light might be generated when using GaN by Nakamura at Nichia Chemistry in 1993. Since white light may be obtained through combining red, green and blue, the development on the GaN-based blue light emitting diode along with already developed red and green light emitting diodes, enabled the accomplishment of a while light emitting diode.

Recently, as the demand on the blue wavelength light emitting diode increases, the demand on a GaN thin film is also increased from day to day. In order to increase the efficiency of the light emitting diode, various methods have been used.

As another expedient to increase the light emitting efficiency, a vertical type light emitting diode increasing the light emitting efficiency by removing the substrate gets the spotlight. The vertical type light emitting diode may be obtained by a laser lift off (LLO) method in which a nitride semiconductor deposited substrate is exposed to a laser and the substrate and the nitride semiconductor are separated, or by a chemical shift off (CLO) method in which a substrate is melted to separate the substrate and the nitride semiconductor. Through the methods, much effort has been made to improve an adverse influence to the nitride semiconductor and to improve defects concerning complicated processes. However, a method giving a high efficiency to a desired degree has not been accomplished yet.

SUMMARY OF THE PRESENTLY CLAIMED INVENTION

Technical Problem

Embodiments provide a compound semiconductor layer having high quality manufactured by a simplified process and relaxing stress due to a lattice constant difference between a substrate and the compound semiconductor layer.

Embodiments also provide a method of separating a substrate from a compound semiconductor while minimizing effects onto the compound semiconductor, and a compound semiconductor device by using the method.

Solution to the Problem

In one embodiment, a method for manufacturing a compound semiconductor includes: forming a graphene-derived material layer on one of a first substrate and a first compound semiconductor layer; forming at least one layer of second compound semiconductor layers on the graphene-derived material layer; and transforming the graphene-derived material layer to separate at least one layer of the second compound semiconductor layers.

The graphene-derived material layer may be a graphene layer. The graphene layer may be transformed into a graphene oxide layer by one method among a chemical treatment method, a heat treatment method and a photo treatment method. Here, a thickness of the graphene oxide layer may be greater than that of the graphene layer, and at least one layer of the second compound semiconductor layers may be lifted up.

The graphene-derived material layer may be a graphene oxide layer. The graphene layer may be transformed by one method among a chemical treatment method, a heat treatment method and a photo treatment method. Here, the graphene oxide layer may be transformed into a transformed graphene oxide layer having a greater thickness than the graphene oxide layer by the heat treatment method, and the graphene oxide layer may be reduced by the chemical treatment method and the photo treatment method into a graphene-like layer having a decreased thickness. Meanwhile, the photo treatment method may be conducted by using a transmission depth selection type photo treatment apparatus, and so, light irradiated from the photo treatment apparatus may function on only the graphene oxide layer.

The graphene-derived material layer may include at least one layer of graphene-derived sheets. The graphene-derived material layer may expose the substrate or the first compound semiconductor layer to the second compound semiconductor layer.

A layer making a contact with the first compound semiconductor layer among at least one layer of the second compound semiconductor layers may have the same properties as properties of the first compound semiconductor layer.

The method may further include: forming a different graphene-derived material layer under the first compound semiconductor layer; and forming a second substrate under the different graphene-derived material layer. In this case, the different graphene-derived material layer may be formed so that the first compound semiconductor layer and the second substrate may make a contact.

The separation of one layer among the second semiconductor layers may be performed by a sonication treatment.

The at least one layer of the second compound semiconductor layers may include an n-type compound semiconductor layer, an active layer, a p-type compound semiconductor layer and a p-type electrode layer, and may be processed to manufacture a light emitting diode. The p-type electrode layer may include a reflective layer.

An n-type electrode layer may be formed at a layer making a contact with the graphene-derived material layer among the at least one layer of the second compound semiconductor layers.

In another embodiment, a compound semiconductor device includes: a substrate or a first compound semiconductor layer; a graphene-derived material layer provided on the substrate or on the first compound semiconductor layer; and at least one layer of compound semiconductor layers provided on the graphene-derived material layer. At least one layer of the compound semiconductor layer may include an n-type compound semiconductor layer; an active layer; a p-type compound semiconductor layer; and an electrode layer.

In further another embodiment, a method for manufacturing a compound semiconductor includes: forming a graphene-derived material layer on a base material; forming at least one layer of second compound semiconductor layers on the graphene-derived material layer; and separating at least one layer of the second compound semiconductor layers through an oxidation reaction or a reduction reaction with respect to the graphene-derived material layer.

Advantageous Effects of the Invention

In accordance with example embodiments, a compound semiconductor layer having high quality may be selectively synthesized by using graphene oxide as a mask, and stress due to lattice constant difference between a substrate and the compound semiconductor layer may be controlled by providing the graphene oxide between the substrate and the compound semiconductor layer.

In accordance with example embodiments, various kinds of interface may be easily separated while minimizing an adverse effect to a compound semiconductor by using physical property difference of diverse materials derived from graphene.

BRIEF DESCRIPTION OF THE DRAWINGS

FIGS. 17 and 18 are scanning electron microscope photographs of compound semiconductors formed in accordance with an example embodiment, in which FIG. 17 is a plan view of a nitride semiconductor and FIG. 18 is a cross-sectional view thereof.

DETAILED DESCRIPTION

Mode for the Invention

Figure 1:
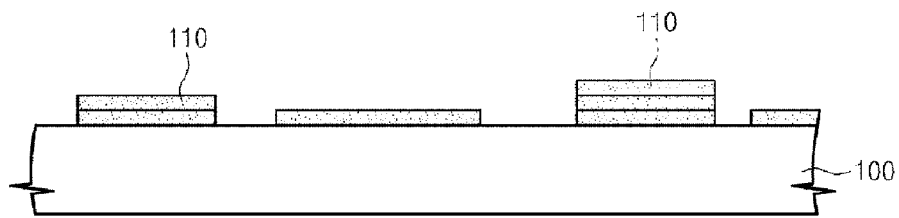
FIGS. 1 to 4 are cross-sectional views for explaining a compound semiconductor device and a method for manufacturing the same in accordance with an example embodiment.

The above objects, other objects, features and advantages will be easily understood through preferred embodiments with reference to accompanying drawings. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

In the specification, it will be understood that when a film (or layer) is referred to as being "on" another film (or layer), it can be directly on or intervening a third film (or layer) may be present. In addition, the sizes or the thicknesses of parts are exaggerated for clarity. In addition, it will be understood that, although the terms first, second, third etc. may be used herein to describe various regions, films (or layers) etc., these regions, films (or layers) should not be limited by these terms. These terms are only used to distinguish one region, or film (or layer) from another region, or film (or layer). Thus, a first layer discussed below could be termed a second layer without departing from the teachings of the present inventive concept. The embodiments explained and illustrated herein may include complementary embodiments thereof.

As used herein, the term "and/or" includes any and all combinations of one or more of the associated listed items. All terms having the same reference numeral used herein have the same meaning.

First Embodiment

FIGS. 1 to 4 are cross-sectional views for explaining a compound semiconductor device and a method for manufacturing the same in accordance with a first embodiment of the present inventive concept.

Referring to FIG. 1, a graphene oxide layer 110 may be formed on a substrate 100. The substrate 100 may be a sapphire, a spinel, a GaAs, an InP, a SiC or a Si substrate. The graphene oxide layer 110 may include a plurality of graphene oxide sheets. Herein, the graphene oxide sheet may refer to graphene oxide pieces constituting the graphene oxide layer. A portion of the surface of the substrate 100 may be exposed between the plurality of the graphene oxide sheets.

The graphene oxide layer 110 may be formed by various methods. For example, graphite is added into sulfuric acid and then, potassium permanganate is slowed added. The temperature is increased to 35° C., and a Teflon-coated magnetic bar is added to conduct stirring for about 2 hours. Then, a sufficient amount of water is added, and hydrogen peroxide is added until a gas is not generated. Then, graphite oxide is filtered by using a glass filter and then is dried at room temperature for about 12 hours or over under vacuum. Into the dried graphite oxide, an appropriate amount of water is added according to the use and a sonication treatment is conducted to delaminate the graphite oxide and to form graphene oxide sheets. As the time period for the sonication treatment increases, the size of the formed graphene oxide sheets decreases. Differently, in order to control the size of the graphene oxide sheets, the stirring using the Teflon coated magnetic bar may be conducted slowly to delaminate the graphite oxide. Differently, the graphene oxide sheets may be formed by various known methods. The shape of the graphene sheets may be formless and may have various forms according to the shape of the graphite oxide, the method of the sonication treatment, and the stirring method.

The thus formed graphene oxide sheets as described above may be deposited on the substrate 100 by various methods. For example, the graphene oxide sheets may be coated on the substrate 100 by at least one method of a spin coating, a Langmuir-Blodgett method or a layer-by-layer method (LBL), a dip coating, a spray coating and a drop coating. In the deposition process, a portion of the graphene oxide layer 110 may be reduced to make a graphene-like structure.

In order to change the chemical properties or the electric properties of the graphene oxide, various functional groups may be added to form a functionalized graphene sheet. The graphene oxide herein may refer to a graphene mono layer as well as few layers of laminated mono layers. In addition, the graphene oxide may refer to a concept including the functionalized graphene sheet.

FIGS. 11 to 14 are scanning electron microscope photographs of substrates on which the graphene oxide layers are formed. In the photographs, black and while portions illustrate the graphene oxide sheets forming the graphene oxide layer 110. From FIG. 11 to FIG. 14, the concentration of the graphite oxide per unit medium increases from about 1 µg/ml to about 100 mg/ml. As illustrated in the drawings, as the concentration of the graphite oxide increases, even larger area of the surface of the substrate 100 may be covered with the graphene oxide layer 110. The length of the long axis of the graphene oxide sheets may be about 50 nm to about 100 µm, and the thickness of the graphene oxide sheet is from about 0.3 nm to about 2 µm. The covering ratio of the upper surface of the substrate 100 by the graphene oxide layer 110 may vary from about 10 to about 100%.

Figure 15:
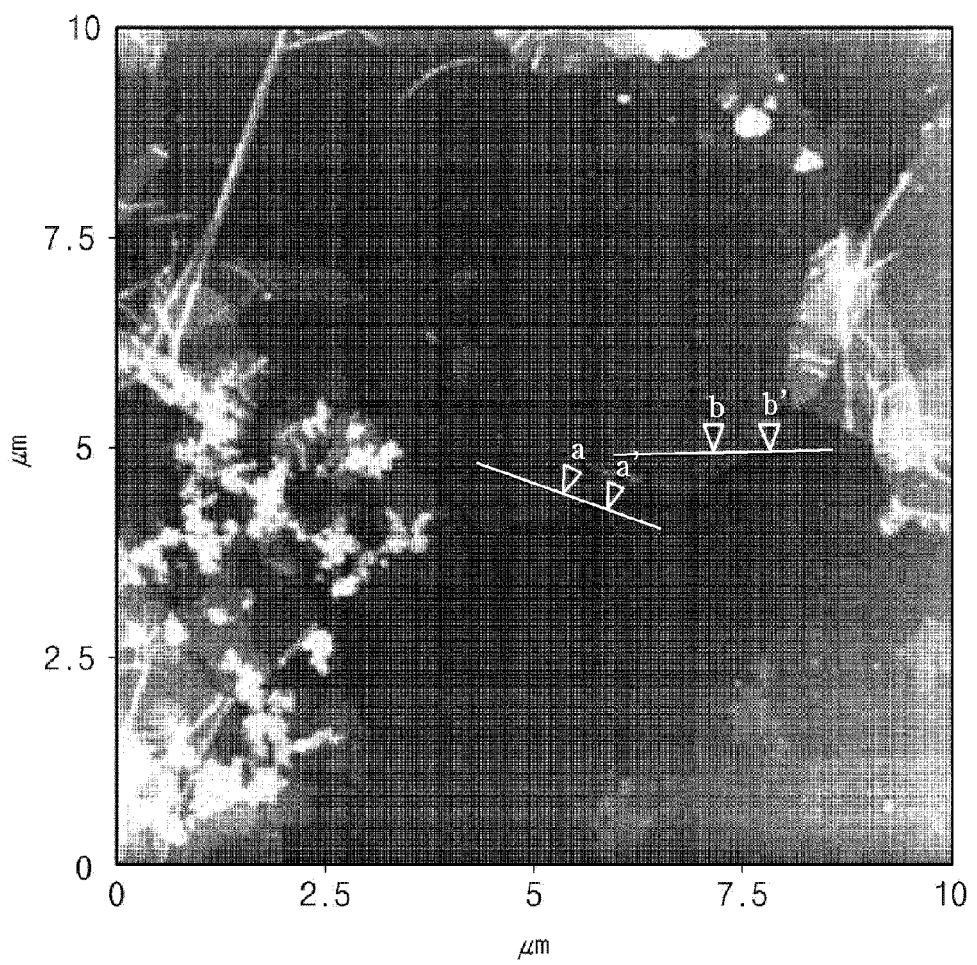
FIG. 15 is an AFM photograph of graphene oxide formed on a substrate.

FIG. 15 is an AFM photograph of the graphene oxide layer 110 formed on the substrate. The thickness of the graphene oxide layer 110 was measured by using AFM. The thickness of the graphene oxide layer 110 when taken along the line a-a' is about 0.3 nm, and the thickness of the graphene oxide layer 110 when taken along the line b-b' is about 1 nm.

The graphene oxide layer 110 may be provided as a specific pattern shape on the substrate 100. That is, the graphene oxide layer 110 may be formed in a portion of the substrate 100, and the graphene oxide layer 110 may not be formed in another region of the substrate 100. In an embodiment, the graphene oxide layer 110 may be provided as a stripe pattern shape on the substrate 100.

The shape of the graphene oxide layer 110, the size and the thickness of the graphene oxide sheets may vary diversely according to the use.

Figure 2:
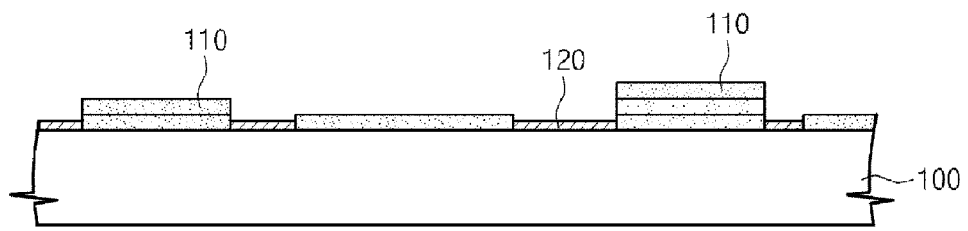
Figure 3:
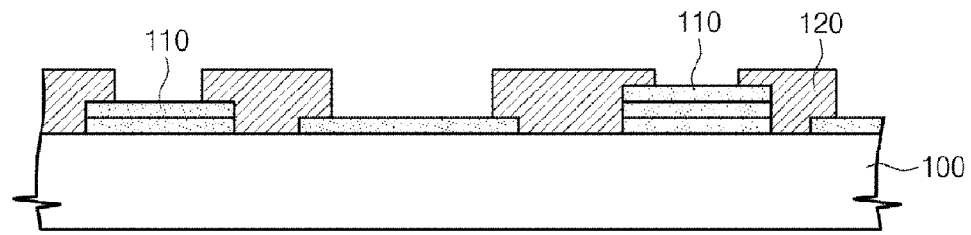
Figure 4:
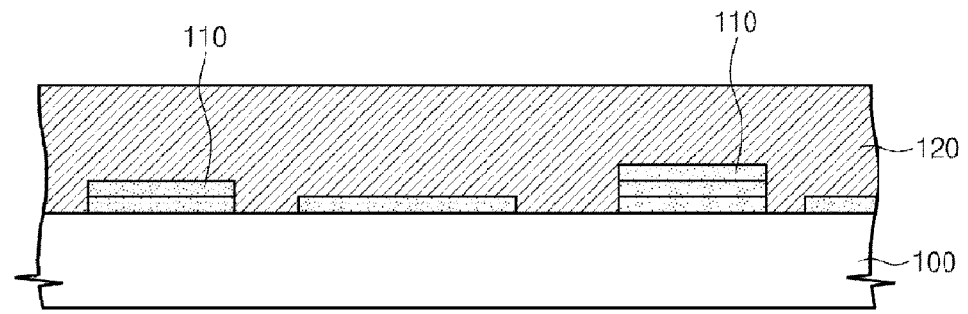

Referring to FIGS. 2 to 4, a first compound semiconductor layer 120 may be formed on the substrate 100 exposed by the graphene oxide layer 110. The first compound semiconductor layer 120 may be a nitride semiconductor layer including at least one of GaN, AlN, InN, AlGaN, InGaN or AlGaInN. The first compound semiconductor layer 120 may be doped with impurity atoms so as to have a certain conductive type. In an embodiment, the first compound semiconductor layer 120 may be an n-type compound semiconductor layer. The first compound semiconductor layer 120 may be doped with various impurity atoms according to the use of the semiconductor layer. For example, at least one atom of Si, Ge, Mg, Zn, O, Se, Mn, Ti, Ni or Fe may be doped. The doping of the impurity atoms may be conducted by an in-situ doping, an ex-situ doping or an ion implantation.

The first compound semiconductor layer 120 may selectively grow while making a contact with the surface of the exposed substrate 100 by using the graphene oxide layer 110 as a mask. For example, the first compound semiconductor layer 120 may be formed by a method among a metal organic chemical vapor deposition (MOCVD), a molecular beam epitaxy (MBE), a liquid phase epitaxy (LPE), a vapor phase epitaxy (VPE), and the like. Particularly, the growth of the first compound semiconductor layer 120 may be conducted at about 650° C. to about 1,200° C. The first compound semiconductor layer 120 may gradually grow from the surface of the substrate 100 exposed by the graphene oxide layer 110 as illustrated in the drawings. As the process proceeds, the crystals formed from the surface of the exposed substrate may grow laterally and connected to each other to grow into a homogeneous semiconductor layer.

As described above, when the first compound semiconductor layer 120 is formed from a portion of the substrate 100, the number of crystalline defects generated at the beginning of the growth due to the difference of crystal constants may be remarkably decreased. In addition, the lateral growth may be promoted and the dislocations may be also laterally bent to decrease the number of the crystalline defects reaching up to the upper surface of a semiconductor device. The graphene oxide layer 110 may have a high elasticity. Thus, the stress generated due to the difference of lattice constants between the substrate 100 and the first compound semiconductor layer 120 may be relaxed.

Second Embodiment

FIGS. 5 to 8 are cross-sectional views for explaining a compound semiconductor device and a method for manufacturing the same in accordance with second embodiments. The explanation on the repeated parts will refer to the explanation in the previous embodiment.

Figure 5:
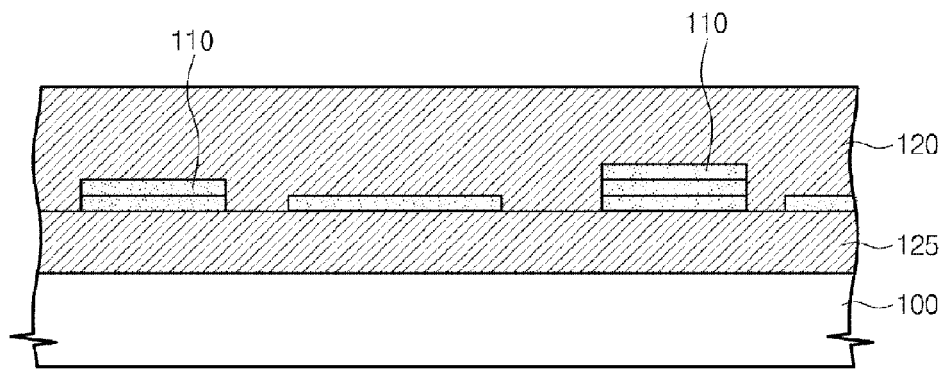
FIGS. 5 to 8 are cross-sectional views for explaining a compound semiconductor device and a method for manufacturing the same in accordance with another example embodiment.

Referring to FIG. 5, a second compound semiconductor layer 125 may be provided between the substrate 100 and the graphene oxide layer 110. In an embodiment, the second compound semiconductor layer 125 may have a thickness of about 1 µm. The second compound semiconductor layer 125 may include the same material as a material of the first compound semiconductor layer 120. The second compound semiconductor layer 125 may have the same conductive-type as a conductive-type of the first compound semiconductor layer 120. In an embodiment, the first and second compound semiconductor layers 120 and 125 may be n-type GaN layers. The graphene oxide layer 110 may expose a portion of the surface of the second compound semiconductor layer 125. The first compound semiconductor layer 120 may selectively grow from the surface of the second compound semiconductor layer 125 exposed between the graphene oxide sheets of the graphene oxide layer 110. From the growing process, a plurality of dislocations generated during forming the second compound semiconductor layer 125 may be blocked to decrease the crystalline defects of the first compound semiconductor layer 120.

Figure 6:
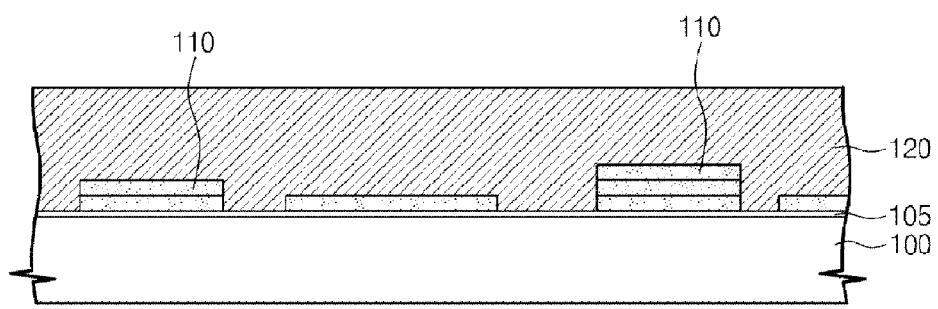
Figure 7:
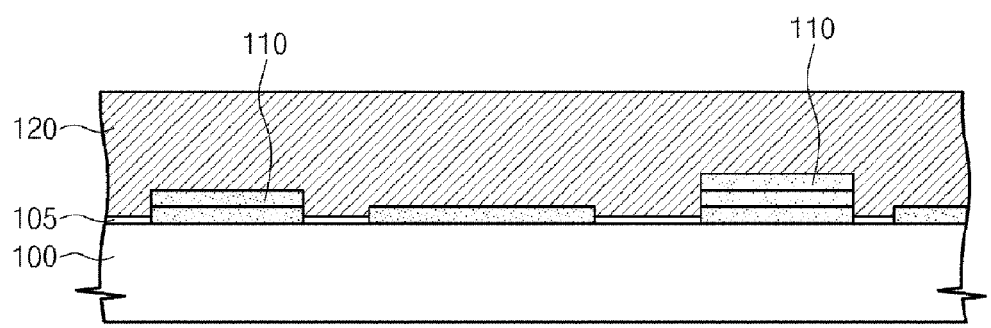

Referring to FIGS. 6 and 7, a buffer layer 105 may be provided between the substrate 100 and the first compound semiconductor layer 120. The buffer layer 105 may decrease the crystalline defects due to the difference of crystal constants between the substrate 100 and the first compound semiconductor layer 120. The buffer layer 105 may include AN, AlGaN, GaN, InGaN, InN, AlGaInN or a combination thereof. When the buffer layer 105 is an AlN, AlGaN or AlGaInN layer, the buffer layer 105 may be formed at about 400° C. to about 1,200° C. to a thickness of about 1 to about 200 nm. When the buffer layer 105 is an InGaN, InN or GaN layer, the buffer layer 105 may be formed at about 400° C. to about 1,000° C. to a thickness of about 1 to about 100 nm. When the first compound semiconductor layer 120 is formed on the buffer layer 105, interface energy may be decreased, and a nuclear formation of a high density may be possible. Thus, semiconductor crystals grown from a plurality of the nuclei may make an interconnection to promote a planar growth. FIG. 6 corresponds to a case when the buffer layer 105 is formed before forming the graphene oxide layer 110, and FIG. 7 corresponds to a case when the buffer layer 105 is provided on the substrate 100 exposed by the graphene oxide layer 110 after forming the graphene oxide layer 110.

Figure 8:
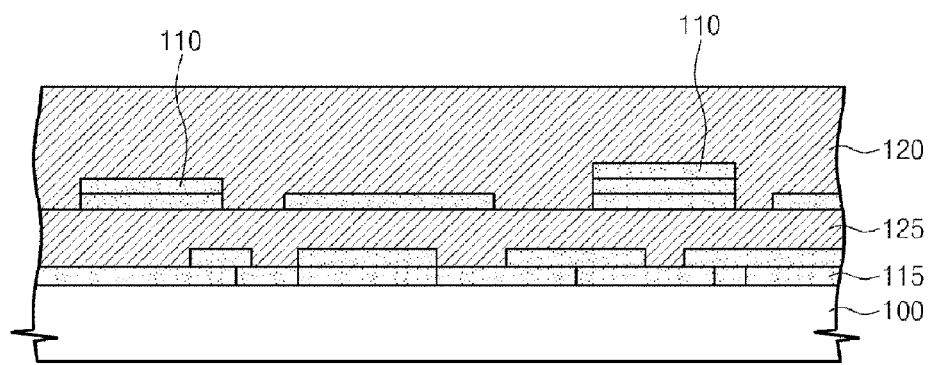

FIG. 8 corresponds to an embodiment in which a second graphene oxide layer 115 is additionally provided between the substrate 100 and the second compound semiconductor layer 125 in the constitution explained in FIG. 4. The second graphene oxide layer 115 may make a contact with the substrate 100 and the second graphene oxide layer 125. The second graphene oxide layer 115 may cover an entire surface of the substrate 100. Due to the high elasticity of the second graphene oxide layer 115, the stress due to the dislocations between the substrate 100 and the second compound semiconductor layer 125 may be relaxed. Different from the drawing, the second graphene oxide layer 115 may expose a portion of the substrate 100 and function as a mask for selective growth along with the first graphene oxide layer 110.

According to the second embodiment as described above, the compound semiconductor layer and the substrate provided on the graphene oxide layer may not make a direct contact. Thus, the crystalline defects of the compound semiconductor layer provided on the graphene oxide layer and the stress due to the defects may be relaxed, and a compound semiconductor layer having high quality may be provided.

Third Embodiment

The growing method of a compound semiconductor in accordance with example embodiments may be used in various devices such as an LED, an LD, a high temperature/high output device, an HEMT, an HBT, and the like. Hereinafter, an embodiment of a device formed by the above growing method will be explained. For brief explanation, the explanation on repeated structure will be omitted.

Figure 9:
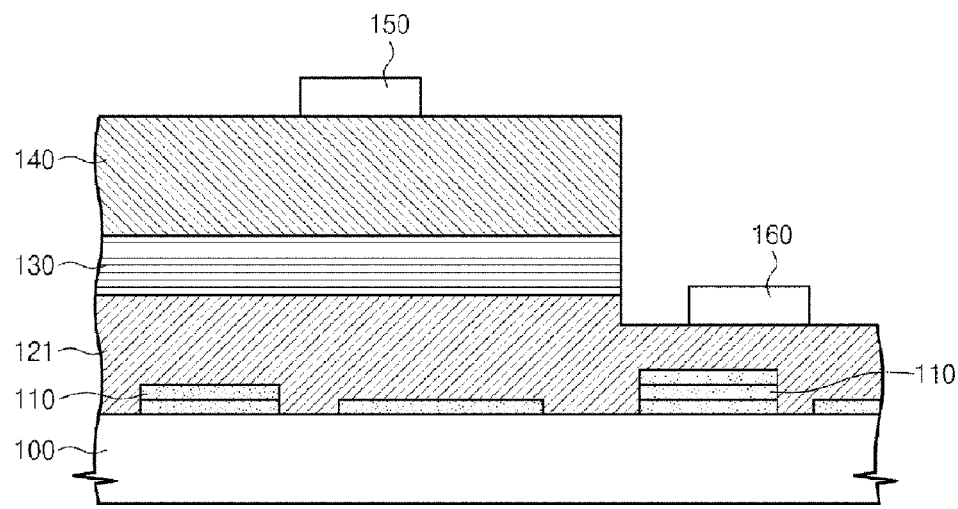
FIGS. 9 and 10 are cross-sectional views of light emitting diodes in accordance with example embodiments.
Figure 10:
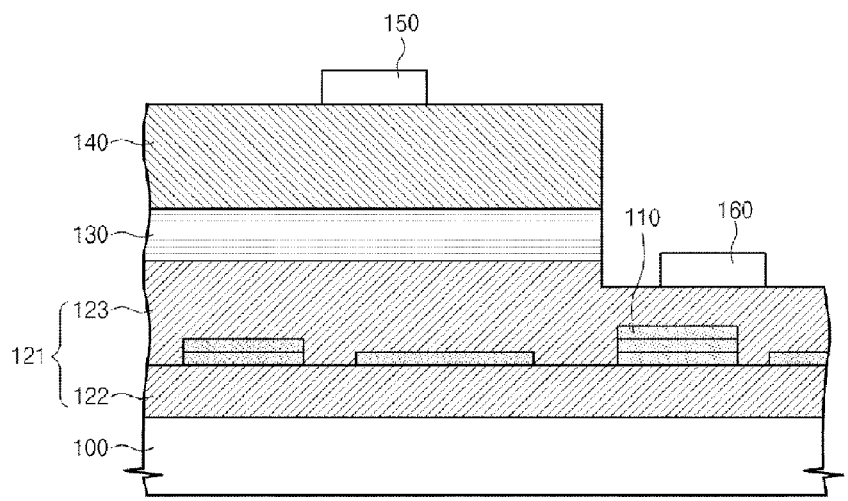
Figure 11:
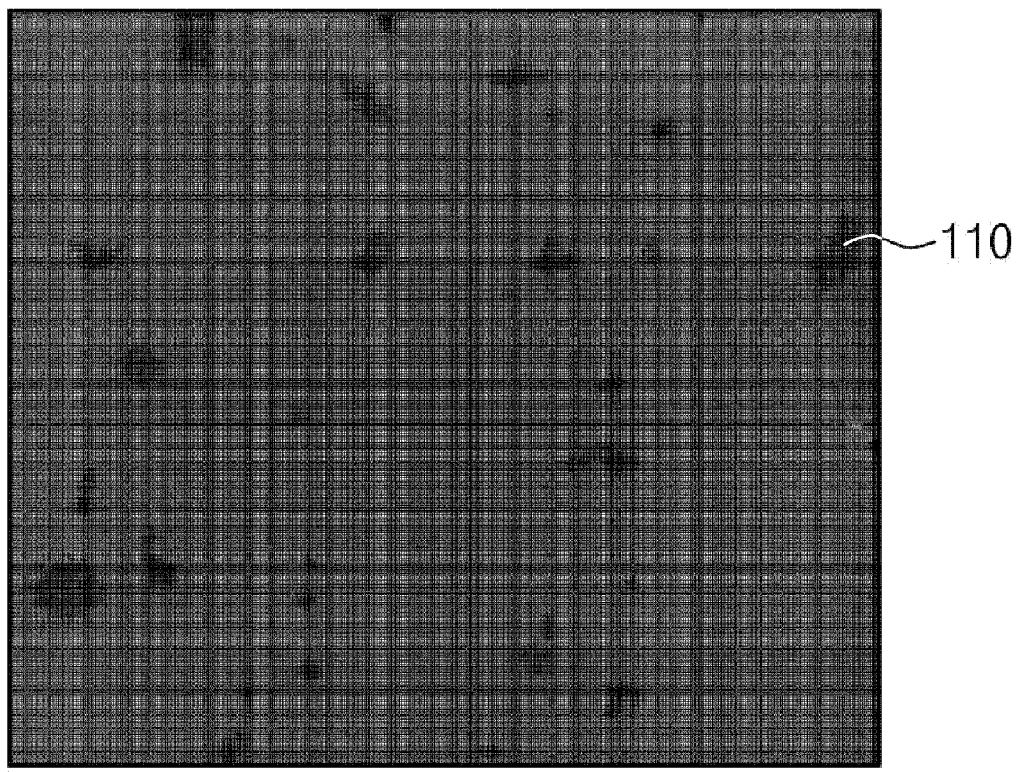
FIGS. 11 to 14 are scanning electron microscope photographs on graphene oxide deposited substrates.
Figure 12:
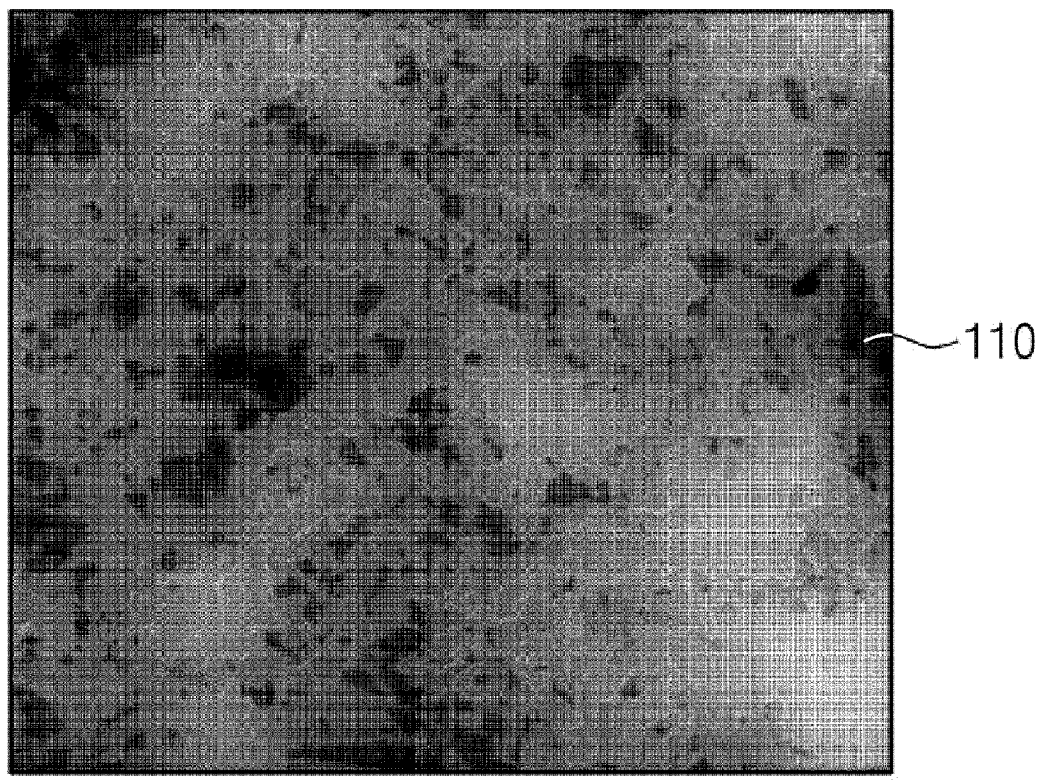
Figure 13:
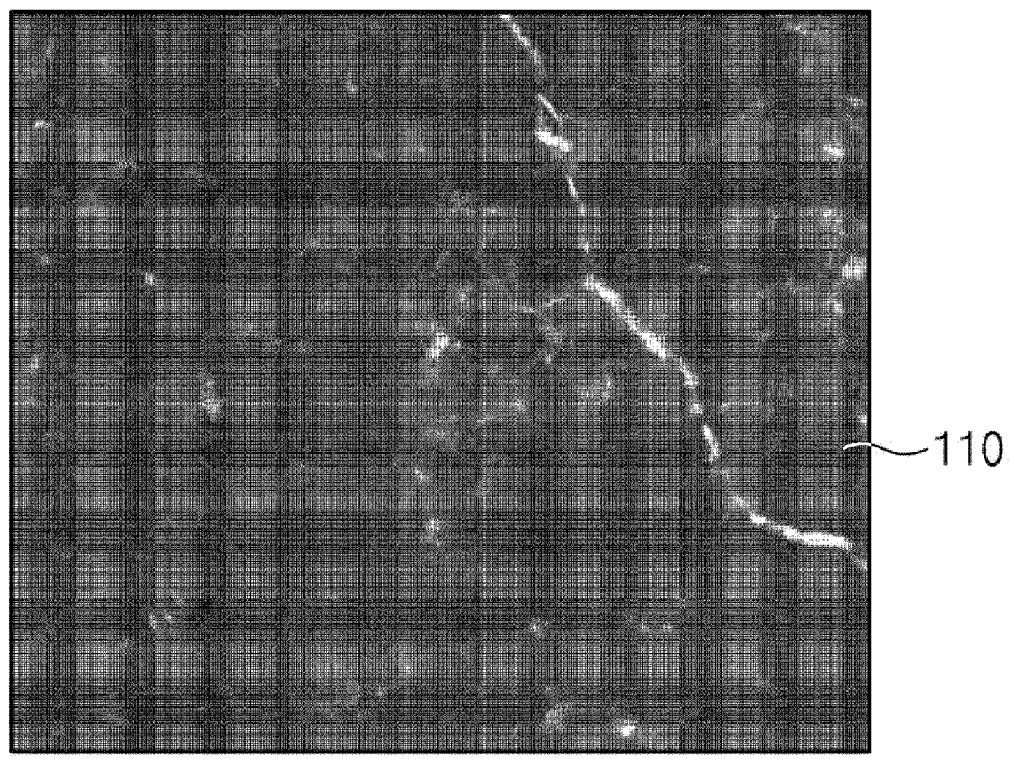
Figure 14:
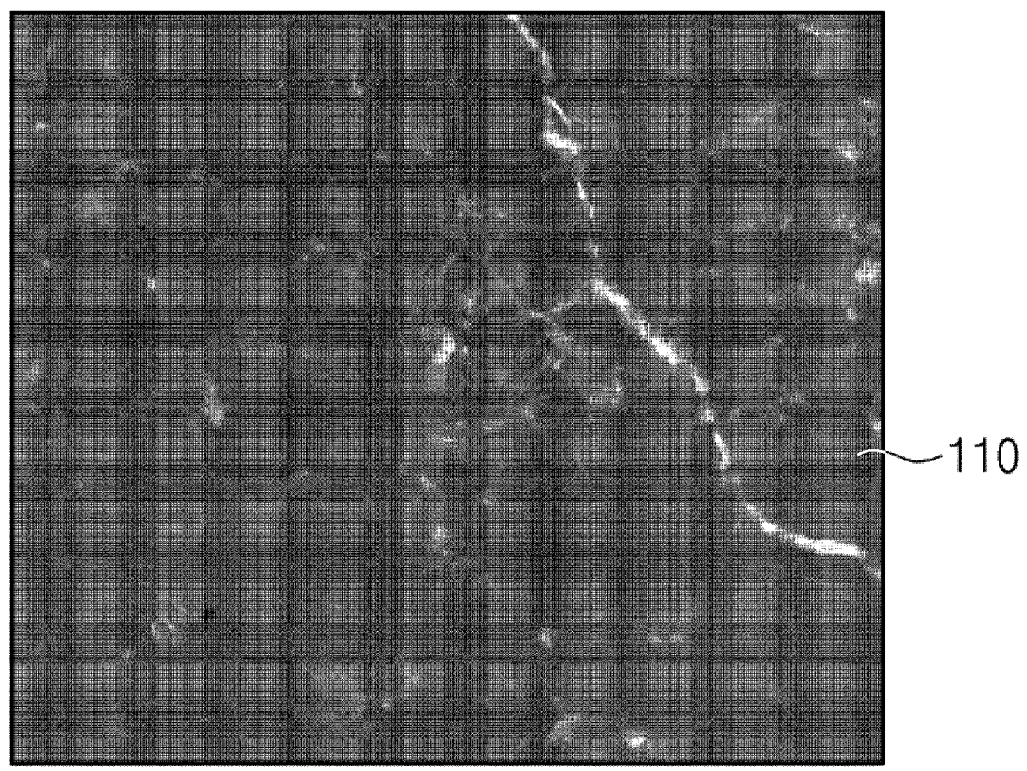

FIGS. 9 and 10 are cross-sectional views of light emitting diodes in accordance with the third embodiment. The light emitting diode may include an n-type compound semiconductor layer 121, an active layer 130, and a p-type compound semiconductor layer 140 integrated one by one. In an embodiment, the n-type and p-type compound semiconductor layers 121 and 140 may be respectively n-type or p-type impurity doped GaN layers. As illustrated in FIG. 9, the graphene oxide layer 110 may be provided between the substrate 100 and the n-type compound semiconductor layer 121. As illustrated in FIG. 10, the n-type compound semiconductor layer 121 may include the first semiconductor layer 122 and the second semiconductor layer 123, and the graphene oxide layer 110 may be provided between the first semiconductor layer 122 and the second semiconductor layer 123.

The active layer 130 may include a multi quantum well (MQW) and barrier layers between the multi quantum layers. The multi quantum layers may generate a light by the recombination of electrons and holes. The multi quantum well and the barrier layer may be $In_xGa_{1-x}N$ ($0 \leq x < 1$) layers having different compositions. The active layer 130 may be formed by a MOCVD, a VPE, or a LPE method. An n-type electrode 160 may be provided on the n-type compound semiconductor layer 121, and a p-type electrode 150 may be provided on the p-type compound semiconductor layer 140. The n-type and p-type electrodes 150 and 160 may be a material including Ni and Au or a material including indium tin oxide (ITO).

The light emitting diode in accordance with example embodiments may include decreased crystalline defects because of the graphene oxide layer 110. Thus, the light emitting efficiency of the light emitting diode may be improved.

Figure 16:
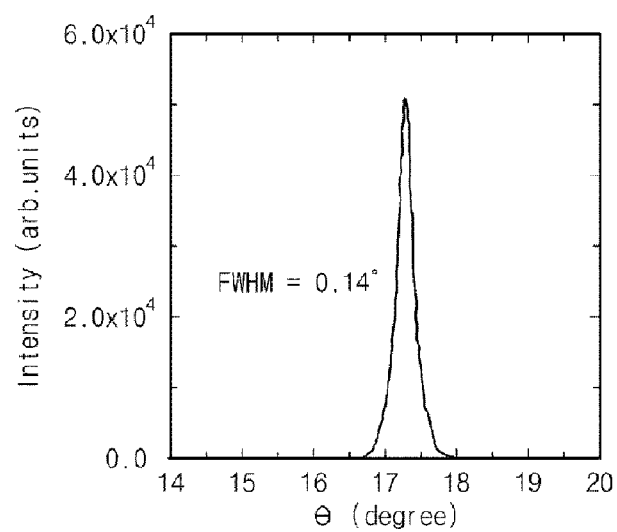
FIG. 16 is an XRD rocking curve of a nitride semiconductor formed in accordance with example embodiments.

FIG. 16 is an XRD rocking curve of a GaN layer formed in accordance with example embodiments. The full width at half maximum (FWHM) of the XRD rocking curve for the GaN layer formed by the selective growth method on the substrate 100 on which the graphene oxide layer 100 is deposited, is about 0.14°, and the quality of the GaN layer formed in accordance with example embodiments is found to be good when compared with a GaN layer formed by a common method.

Figure 17:
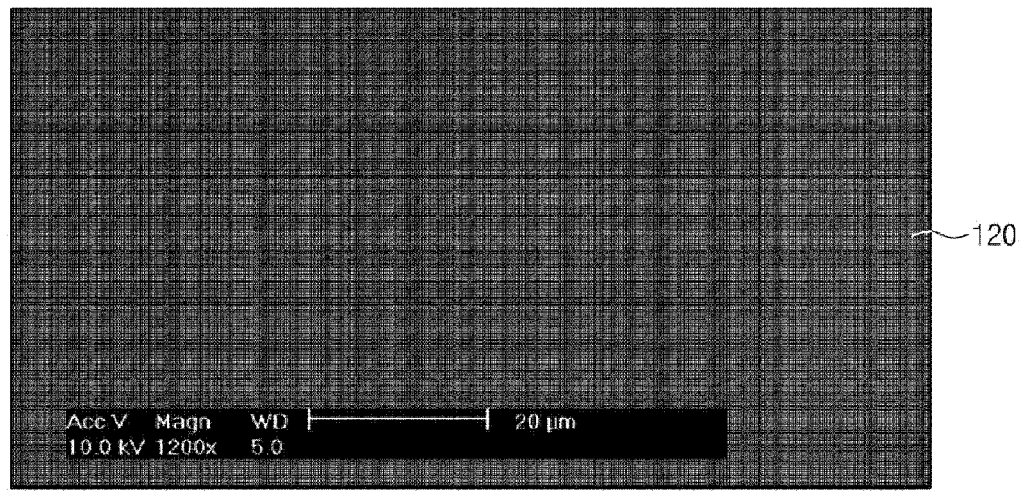
Figure 18:
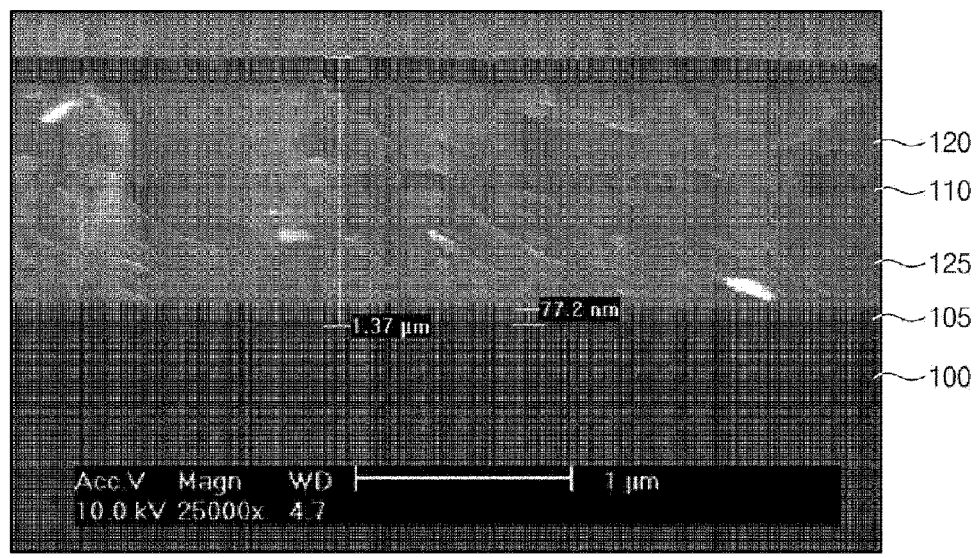

FIGS. 17 and 18 are scanning electron microscope photographs of a nitride semiconductor formed in accordance with an example embodiment, in which FIG. 17 is a plan view of a compound semiconductor and FIG. 18 is a cross-sectional view thereof. A silicon substrate was used as the substrate, and a GaN layer was deposited as the compound semiconductor layer. As illustrated in FIG. 18, a buffer layer 105, a second compound semiconductor layer 125, a graphene oxide layer 110 and a first compound semiconductor layer 120 were formed one by one on the substrate 100. The buffer layer 105 having a thickness of about 77.2 nm was formed on the substrate 100, and the total thickness of the buffer layer 105, the second compound semiconductor layer 125, the graphene oxide layer 110 and the first compound semiconductor layer 120 may be about 1.37 µm. As illustrated in FIG. 17, the surface of the first compound semiconductor layer 120 formed in accordance with example embodiments includes few lattice defects.

According to the third embodiment, a compound semiconductor layer having high quality may be formed, and a light emitting diode having even more improved light emitting efficiency may be manufactured.

Fourth Embodiment

Graphene is arranged in a single layer having a hexagonal network structure or mesh structure through carbon atoms making three covalent bonds per each carbon atom. The graphene has a single layer, and a graphene sheet may be formed through laminating the graphene. The thickness of the single layer of the graphene may be about 3 angstroms. When the graphene is oxidized to form graphene oxide, oxygen may be introduced between the graphene single layers. The introduced position of the oxygen may be different from the extending direction of the single layered graphene. That is, when the extending direction is set to a horizontal direction, the position of the oxygen may be spaced in a vertical direction of the graphene.

Due to the molecular structure, the thickness of the graphene oxide of the single layer may be about 5 angstrom to 10 angstrom and may be increased than the thickness of the graphene before the oxidation. Therefore, the thickness of the graphene sheet and the graphene oxide sheet including a single layer or an integrated few layers may be increased. The embodiment herein relates to a compound semiconductor device and a method for manufacturing a compound semiconductor by using a separating phenomenon of each layer with the graphene as a boundary by using the above-described phenomenon illustrated through the oxidation of the graphene. A large portion of the explanation may be referred to the previous example embodiments, and a portion omitting particular explanation will refer to the explanation in the previous example embodiments.

Figure 19:
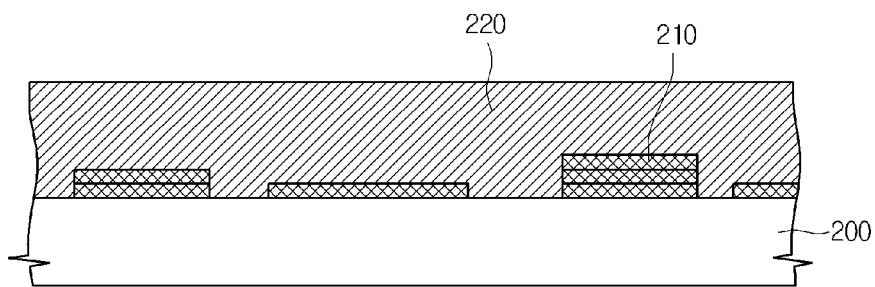
FIGS. 19 and 20 are cross-sectional views on a compound semiconductor device for explaining a method for manufacturing a compound semiconductor device.
Figure 20:
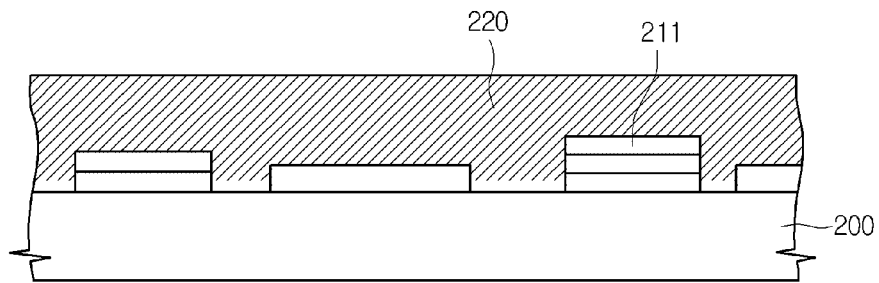

FIGS. 19 and 20 are cross-sectional views on a compound semiconductor device for explaining a method for manufacturing a compound semiconductor device in the fourth embodiment.

A first compound semiconductor layer 220 may be formed on a substrate 200 exposed through a graphene layer 210. The graphene layer 210 may include a plurality of graphene sheets. The graphene sheet may include non-oxidized graphene strips constituting the graphene layer. The first compound semiconductor layer 220 may be a nitride semiconductor layer including at least one of GaN, AlN, InN, AlGaN, InGaN or AlGaInN. The first compound semiconductor layer 220 may be doped with impurity atoms so as to have a certain conductive type. In an embodiment, the first compound semiconductor layer 220 may be an n-type compound semiconductor layer. The first compound semiconductor layer 220 may be doped with various impurity atoms according to the use of the semiconductor layer. For example, at least one atom among Si, Ge, Mg, Zn, O, Se, Mn, Ti, Ni or Fe may be doped. The doping of the impurity atoms may be conducted by an in-situ doping, an ex-situ doping or an ion implantation.

The first compound semiconductor layer 220 may be selectively grown while making a contact with the surface of the exposed substrate 200 by using the graphene layer 210 as a mask. For example, the first compound semiconductor layer 220 may be formed a method among a metal organic chemical vapor deposition (MOCVD), a molecular beam epitaxy (MBE), a liquid phase epitaxy (LPE), a vapor phase epitaxy (VPE), and the like. Particularly, the growth of the first compound semiconductor layer 220 may be conducted at about 650° C. to about 1,200° C. The first compound semiconductor layer 220 may gradually grow from the surface of the substrate 200 exposed by the graphene layer 210 as illustrated in the drawings. As the process proceeds, the crystals formed from the surface of the exposed substrate may grow laterally and connected to each other to grow into a homogeneous semiconductor layer.

The graphene layer 210 illustrated in FIG. 19 is oxidized. FIG. 20 is a cross-sectional view of a compound semiconductor device in which the graphene layer 210 is oxidized into a graphene oxide layer 211. Referring to FIG. 20, when the graphene layer 210 is oxidized into the graphene oxide layer 211, oxygen atoms may be introduced between the graphene to increase the thickness. According to the increase of the thickness of the graphene layer 210, the first compound semiconductor layer 220 supported by the graphene layer 210 may be lift up, and thus, may be separated from the substrate 200. When the separation of the first compound semiconductor layer 220 from the substrate 200 is not smooth due to the facts such as the kind of the compound semiconductor, the area of the graphene layer 210 covering the substrate 200 may be increased. In some cases, the graphene layer 210 may cover an entire region of the substrate 200.

Hereinafter, example embodiments on the oxidation of the graphene layer 210 will be explained.

First Oxidation Method

The method may be a chemical treatment method, and the graphene layer 210 may be oxidized into graphene oxide by so-called a modified hummer's method. Particularly, an object to be oxidized is added into sulfuric acid and then, potassium permanganate ($KMnO_4$) is slowed added. The temperature is increased to about 35° C., and a Teflon-coated magnetic bar is added to conduct stirring for about 2 hours. Then, a sufficient amount of water is added, and hydrogen peroxide is added until a gas is not generated. Then, a drying may be performed to oxidize the graphene.

An acid treatment at a low temperature during the above-described oxidation process may be also used in a cleaning process of a compound semiconductor, and no adverse effect may be generated in the compound semiconductor. Meanwhile, the graphene layer may be chemically oxidized by various known methods.

In order to promote the separation of the lifted compound semiconductor layer 220 from the substrate 200 due to the oxidation of the graphene layer 210, a sonication treatment may be conducted to apply physical vibration to rapidly separate the compound semiconductor layer 220. This treatment may be also applied in the following embodiments.

Second Oxidation Method

A heat treatment method may be used to oxidize the graphene layer 210 into the graphene oxide layer 211.

Particularly, when the temperature of a furnace of oxygen ambient is controlled to about 400° C. or over, an oxidation reaction may be carried out by the oxygen in the ambient with a carbon atom of the graphene layer 211. Since the heat treatment may be conducted with oxygen included in an atmosphere, the atmosphere may be also used as the ambient gas.

Third Oxidation Method

A photo treatment method may be used to oxidize the graphene layer 210 into the graphene oxide layer 211. For example, a high energy pulse light may be applied to the graphene layer 210 to conduct an oxidation treatment.

As described above, numerous methods for conducting the oxidation treatment may be suggested. Among the methods, the chemical treatment method may be preferred for oxidizing the graphene layer 210 into the graphene oxide layer 211 in view of the confirmation of the efficiency of the oxidation reaction without affecting the semiconductor during the oxidation treatment using a compound.

According to the example embodiments, the substrate of the compound semiconductor layer 220 may be separated in high efficiency, and the separated compound semiconductor layer 220 may be used as a light emitting diode having a high efficiency.

Fifth Embodiment

In the fourth embodiment, the compound semiconductor layer is provided so as to make a contact with the substrate. Thus, the lattice defects may be possibly transferred to the compound semiconductor layer. This embodiment is suggested considering the defects. In explaining this embodiment, the explanation on the repeated parts in the previous example embodiments will be referred to the explanation in the previous example embodiments.

Figure 21:
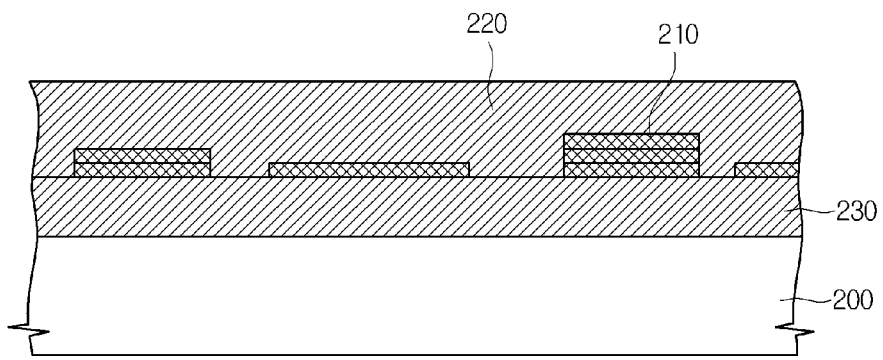
FIGS. 21 and 22 are cross-sectional views of a compound semiconductor device for explaining the change of a graphene layer.
Figure 22:
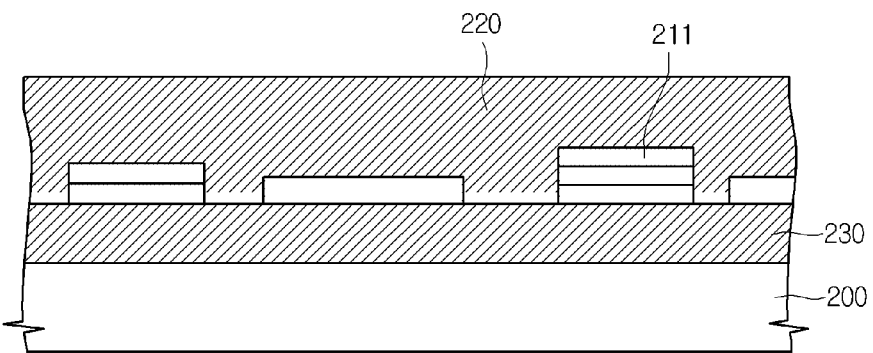

FIGS. 21 and 22 are cross-sectional views of a compound semiconductor device. Through the oxidation reaction of the graphene layer 210 in the compound semiconductor device suggested in FIG. 21, the graphene layer 210 may be oxidized to the graphene oxide layer 211 as illustrated in FIG. 22.

Referring to FIG. 21, a second compound semiconductor layer 230 may be provided between the substrate 200 and the graphene layer 210. In an embodiment, the thickness of the second compound semiconductor layer 230 may be about 1 µm. The second compound semiconductor layer 230 may include the same material as a material of the first compound semiconductor layer 220. The second compound semiconductor layer 230 may have the same conductive type as a conductive type of the first compound semiconductor layer 220. In an embodiment, the first and second compound semiconductor layers 220 and 230 may be n-type GaN layers. The graphene layer 210 may expose a portion of the surface of the second compound semiconductor layer 230. From the surface of the second compound semiconductor layer 230 exposed between the graphene sheets of the graphene layer 210, the first compound semiconductor layer 220 may be selectively laminated. Through the laminating process, a plurality of dislocations generated during forming the second compound semiconductor layer 230 may be blocked, and the crystalline defects of the first compound semiconductor layer 220 may be decreased.

Referring to FIG. 22, when the graphene layer 210 is oxidized to the graphene oxide layer 211, oxygen atoms may be introduced between the graphene to increase the thickness. According to the increase of the thickness of the graphene layer 210, the first compound semiconductor layer 220 supported by the graphene layer 210 may be lifted up, and may be separated from the substrate 200. When the separation of the first compound semiconductor layer 220 from the substrate 200 is not smooth due to factors such as the kind of the compound semiconductor, the area of the graphene layer 210 covering the substrate 200 may be increased. In some cases, the graphene layer 210 may cover an entire region of the second compound semiconductor layer 230. Through conducting a sonication treatment, the separation of the semiconductor layer may be easily facilitated.

The oxidizing methods of the graphene layer 210 may include the chemical treatment method, the heat treatment method, and the photo treatment method, and the explanation of the fourth embodiment may be applied.

Sixth Embodiment

In the fourth embodiment and the fifth embodiment, methods of separating a compound semiconductor layer by oxidizing a graphene layer into a graphene oxide layer have been suggested. Different from these methods, in the sixth embodiment, a method of separating a compound semiconductor layer by laminating a graphene oxide layer during laminating a semiconductor device and heat treating the graphene oxide layer is illustrated. The explanation on the repeated parts in the previous example embodiments will be cited.

Figure 23:
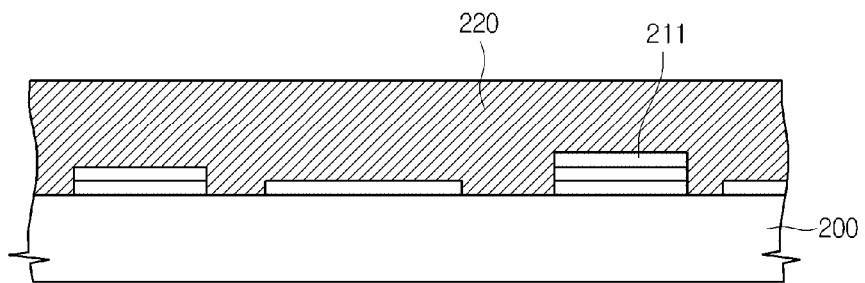
FIGS. 23 and 24 are cross-sectional views of a compound semiconductor device for explaining the change of a graphene oxide layer.
Figure 24:
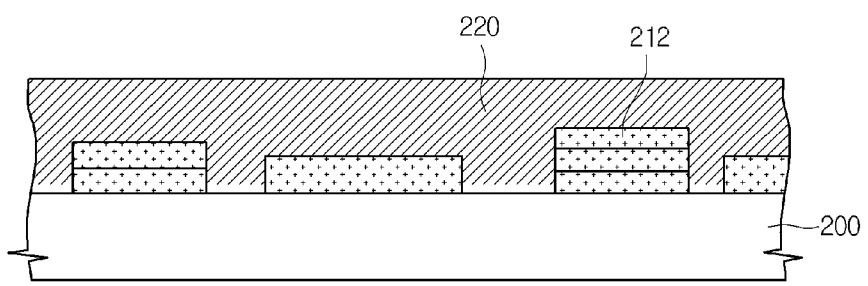

FIGS. 23 and 24 are cross-sectional views of a compound semiconductor device. When the graphene oxide layer 211 in the compound semiconductor device suggested in FIG. 23 is heat treated, the graphene oxide layer 211 may be changed into a transformed graphene oxide layer 212 as suggested in FIG. 24.

Referring to FIG. 23, a substrate 200, a graphene oxide layer 211, and a first compound semiconductor layer 220 may be provided. The compound semiconductor device suggested in FIG. 23 is heat treated at about 300° C. or over in an argon (Ar), a nitrogen ($N_2$), or an oxygen ($O_2$) atmosphere. Through the heat treatment in the condition, the chemical bonds in the graphene oxide sheet of the graphene oxide layer 211 may be detached, separated, and transformed physically. This transformation may be called as pop-up. The heat treated graphene oxide may be called as a transformed graphene oxide layer 212, and the graphene oxide sheet included in the transformed graphene oxide layer 212 may be called as a transformed graphene oxide sheet.

In the transformed graphene oxide layer 212, interference between neighboring transformed graphene oxide sheets may be generated due to the physical transformation of the transformed graphene oxide sheet, and so, the thickness may be increased. The separation of the substrate 200 and the first compound semiconductor layer 220 due to this phenomenon is as described above.

Figure 25:
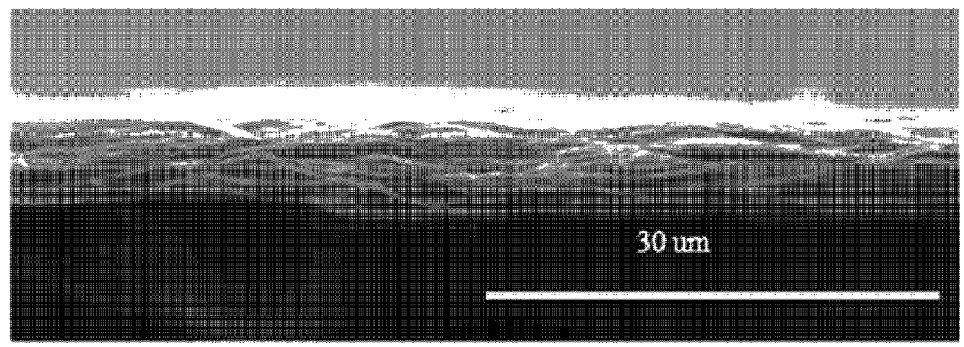
FIGS. 25 and 26 are scanning electron microscope photographs of a compound semiconductor device, in which FIG. 25 corresponds to a photograph before heat treating graphene oxide, and FIG. 26 corresponds to a photograph after heat treating the graphene oxide.
Figure 26:
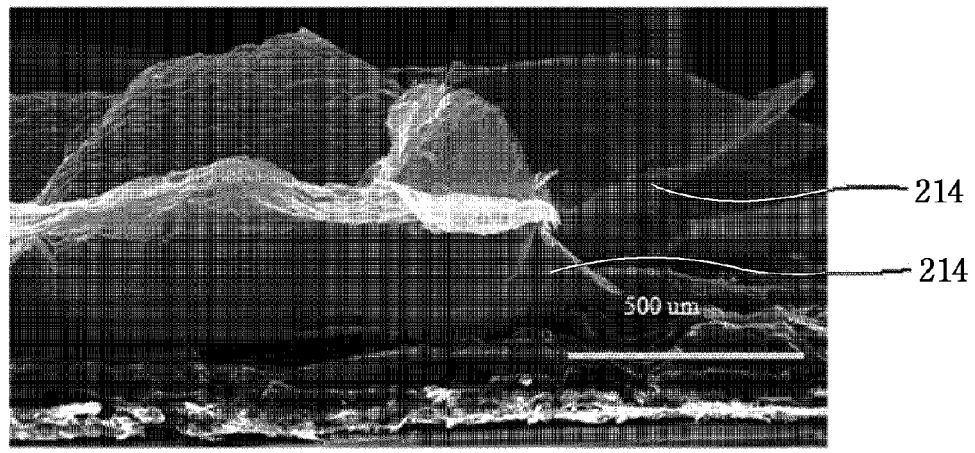

FIGS. 25 and 26 are scanning electron microscope photographs of a semiconductor device in accordance with example embodiments, in which FIG. 25 corresponds to a photograph before a heat treatment, and FIG. 26 corresponds to a photograph after the heat treatment. Referring to FIG. 26, the graphene oxide sheet may be transformed by the heat treatment into the transformed graphene oxide sheet 214. Quite a large degree of transformation may be generated by the transformed graphene oxide sheets 214, and the transformation state may be overlapped with an adjacent transformed graphene oxide sheet to increase the thickness of the transformed graphene oxide layer 212 when compared with the graphene oxide layer 211.

According to this example embodiment, the graphene oxide layer may be transformed into the transformed graphene oxide layer to separate a compound semiconductor layer.

Figure 27:
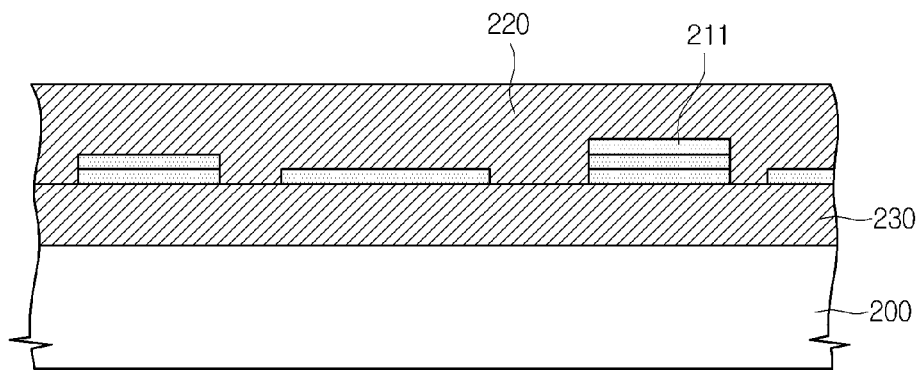
FIGS. 27 and 28 are cross-sectional views of a compound semiconductor device including other intervening compound semiconductor layer.
Figure 28:
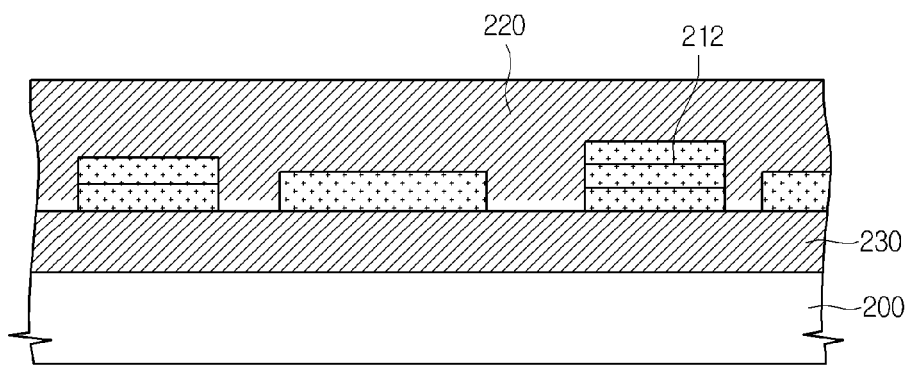

FIGS. 27 and 28 are cross-sectional views of a compound semiconductor device in accordance with another example embodiment, and are different from FIGS. 25 and 26 in that a second compound semiconductor layer 230 is provided between a substrate 200 and a graphene oxide layer 211. Here, the thickness of the second compound semiconductor layer 220 may be about 1 µm. The second compound semiconductor layer 230 may include the same material as a material of the first compound semiconductor layer 220. In case when a heat treatment is applied to the semiconductor device in accordance with this example embodiment, the graphene oxide layer 211 may be popped-up to possibly separate the first compound semiconductor layer 220.

In accordance with an example embodiment, a plurality of the dislocations generated during forming the second compound semiconductor layer 230 may be blocked, and the crystalline defects of the first compound semiconductor layer 220 may be decreased.

Seventh Embodiment

According to the sixth embodiment, the compound semiconductor layer was separated by the heat treatment of the graphene oxide layer. In this seventh embodiment, the compound semiconductor layer may be separated through the reduction of the graphene oxide layer. The explanation on the repeated parts in the previous example embodiments will be cited as it is.

Figure 29:
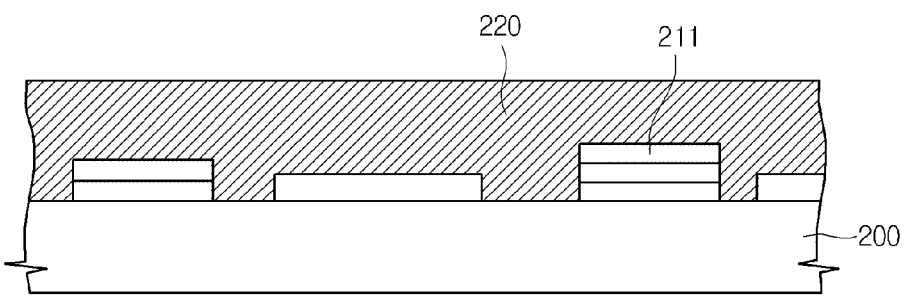
FIGS. 29 and 30 are cross-sectional views of a compound semiconductor device for explaining the reduction of a graphene oxide layer.
Figure 30:
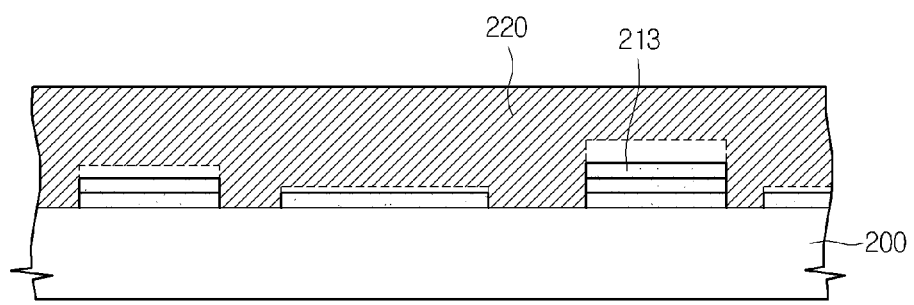

FIGS. 29 and 30 are cross-sectional views of a compound semiconductor device. Referring to FIG. 29, a substrate 200, a graphene oxide layer 211 and a compound semiconductor layer 220 may be provided. When the graphene oxide layer 211 in the compound semiconductor device suggested in FIG. 29 is reduced, a graphene-like layer 213 as suggested in FIG. 30 may be obtained. The graphene-like layer 213, as described above, may be provided by gathering the graphene sheets of the graphene-like structure formed through the reduction of the graphene oxide sheets.

Through the reduction reaction of the graphene-like layer 213, the oxygen positioned in the spacing portion between the graphene may be eliminated, and the thickness may be decreased from the original thickness of the graphene oxide layer 212. When the thickness of the graphene oxide layer 212 is decreased, the compound semiconductor layer 220 may not be supported by the graphene-like layer 213 any more and may have a floating structure. Thus, the compound semiconductor layer 220 may be separated even by a small external impact, and the separation may be achieved more easily through a sonication treatment. In addition, when the graphene oxide layer 211 entirely covers the bottom surface of the compound semiconductor layer 220, the compound semiconductor layer 220 may be completely separated.

Figure 31:
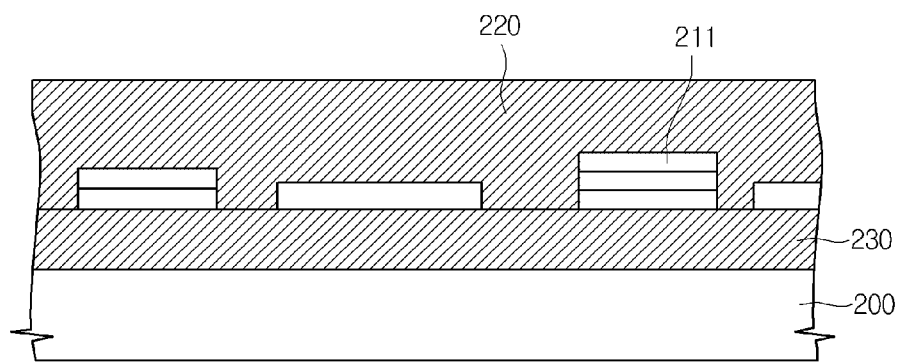
FIGS. 31 and 32 are cross-sectional views of a compound semiconductor device including other intervening compound semiconductor layer.
Figure 32:
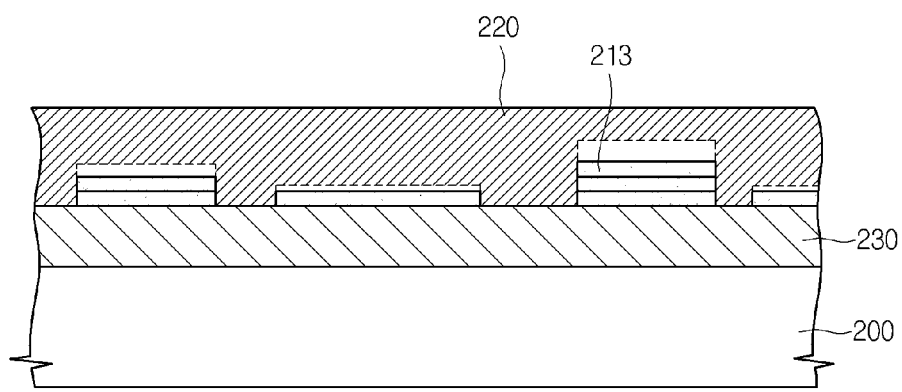

FIGS. 31 and 32 are cross-sectional views of a compound semiconductor device in accordance with other example embodiments, in which a second compound semiconductor layer 230 is provided between a substrate 200 and a graphene oxide layer 211. The thickness of the second compound semiconductor layer 230 may be about 1 μm. The second compound semiconductor layer 230 may include the same material as a material of the first compound semiconductor layer 220. When the graphene oxide layer 211 of the compound semiconductor device in accordance with this example embodiment is reduced, the thickness of the graphene oxide layer 211 may be decreased to the thickness of the graphene-like layer 213. Thus, the first compound semiconductor layer 220 may be separated.

In accordance with this example embodiment, a plurality of the dislocations generated during forming the second compound semiconductor layer 230 may be blocked, and the crystalline defects of the first compound semiconductor layer 220 may be decreased.

In accordance with this example embodiment, a method of reducing the graphene oxide layer 211 will be explained.

First, a chemical treatment method may be applied. Particular experiment was performed under the following conditions. A reducing agent may include 1,1-dimethylhydrazine, sodium borohydride, hydroquinone, and the like, and a solvent may include a mixture of water and dimethylformamide (DMF). In the experiment, a reducing solution obtained by mixing a mixture solvent of about 4 ml of water and about 36 ml of DMF with about 100 mg of a reducing agent was used. The graphene oxide layer 211 was reduced by using the reducing solution to form a graphene-like layer 213. From the experimental result, it was confirmed that the graphene oxide layer 211 was transformed into the graphene-like layer 213, the thickness was decreased, and the compound semiconductor layer was separated.

A photo treatment method may be applied as another method. Particular experiment was conducted according to the following conditions. A photo treatment apparatus with a trade name of "Pulse forge 3300" may be used as a transmission depth selection type photo treatment apparatus for controlling the depth of a light absorbed, to irradiate a compound semiconductor device. By using the photo treatment apparatus, the irradiated light may be absorbed by an object at a specific depth. Thus, the light irradiation may be controlled so that the compound semiconductor layer excluding the graphene oxide layer 211 may not be adversely affected. As the particular conditions of the light irradiation, a bank voltage of about 450 V, a pulse duration time of about 350 μs, an overlap coefficient of about 2.0, and a pulse wave having FRM of ~33 were used, and the output was about 100 kW/cm². The irradiation was conducted by the conditions to reduce the graphene oxide layer 211 to form a graphene-like layer 213. The graphene oxide layer 211 may be transformed into the graphene-like layer 213, and the thickness may be decreased. The separation of the compound semiconductor layer was confirmed.

Here, the light irradiation may be a scanning type method or a flood exposing type method.

In accordance with an example embodiment, the compound semiconductor layer may be separated through transforming the graphene oxide layer 211 into the graphene-like layer 213.

Eighth Embodiment

According to the seventh embodiment, it was suggested that the compound semiconductor may be separated by using a reduction reaction of a graphene oxide layer. Meanwhile, by using the controlling method of the depth of the absorbed light suggested in the photo treatment method of the seventh embodiment, an embodiment of obtaining a compound semiconductor having even better quality will be suggested. The explanation in the previous example embodiments will be referred to for the omitted particular explanations.

Figure 33:
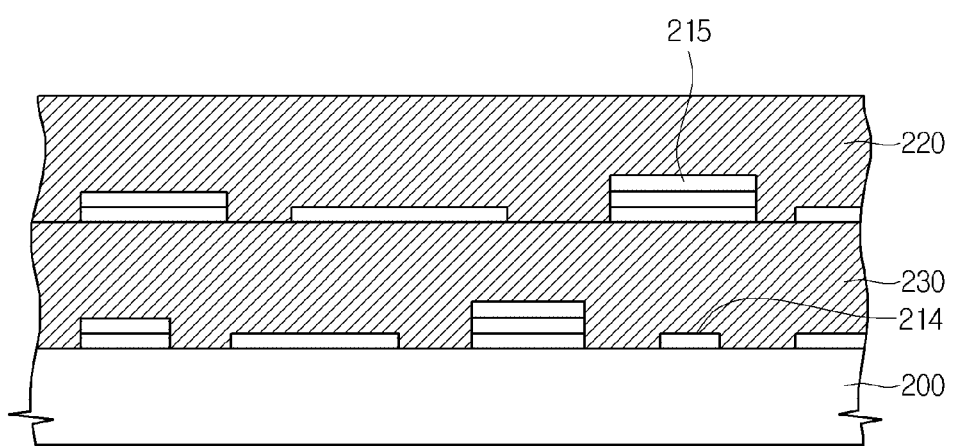
FIG. 33 is a cross-sectional view of a semiconductor device in accordance with an example embodiment.

FIG. 33 is a cross-sectional view of a semiconductor device in accordance with the eighth embodiment. Referring to FIG. 33, a substrate 200, a first compound semiconductor layer 220, a second compound semiconductor layer 230, a first graphene oxide layer 214 disposed between the substrate 200 and the second compound semiconductor layer 230, a second graphene oxide layer 215 provided between the first compound semiconductor layer 220 and the second compound semiconductor layer 230 may be illustrated. The compound semiconductor layers 220 and 230 may include the same material, may have the same conductive type, or may be provided as n-type GaN.

When the photo treatment apparatus suggested in the seventh embodiment is used, the depth of the light absorbed may be controlled. Thus, the substrate 200 and the second compound semiconductor layer 230 may be separated when a light is irradiated onto the first graphene oxide layer 214. In this case, the semiconductor device may be used with the first and second compound semiconductors 220 and 230 attached to each other, and the substrate 200 may be reused. In addition, when the light is irradiated onto the second graphene oxide layer 215, the first compound semiconductor layer 220 and the second compound semiconductor layer 230 may be separated. This embodiment may be used when only the first compound semiconductor layer 220 having high quality is to be applied in a semiconductor device later.

The principle of the separation of the graphene oxide layers 214 and 215 by the light irradiation was explained in the seventh embodiment in detail. In accordance with this example embodiment, the compound semiconductor device may be separated into various shapes, and this advantage may be obtainable through the previous example embodiments.

Meanwhile, two or more graphene oxide layers may absorb light at the same time by means of the photo treatment apparatus. In this case, at least two graphene oxide layers may separate the compound semiconductor layer. Thus, the compound semiconductor may be manufactured more efficiently.

In the fourth to eighth example embodiments, the graphene-derived material layer such as a graphene layer, a graphene oxide layer, a graphene-like layer and a transformed graphene oxide layer, may be transformed into other graphene-derived material layer. Hereby, the concept of separating other material layer having an interface with the graphene-derived material layer may be suggested. In this case, the graphene-derived material layer may not be limited to the above-described examples, and other material layers may be used as the graphene-derived material layer.

Ninth Embodiment

A compound semiconductor device using the separating method of the graphene oxide layer and the graphene layer suggested through the fourth example embodiment to the eighth example embodiment will be disclosed in the ninth embodiment.

Figure 34:
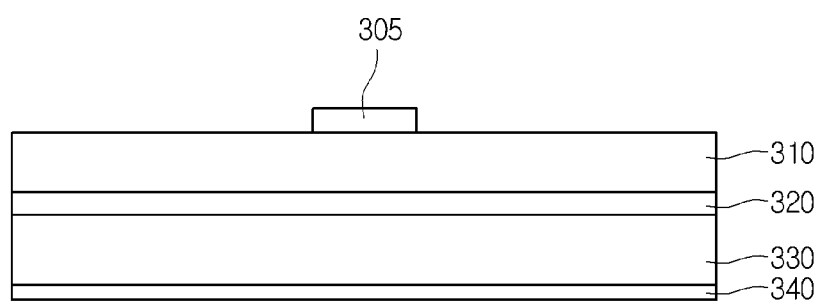
FIG. 34 is a cross-sectional view of a compound semiconductor device in accordance with an example embodiment.

FIG. 34 is a cross-sectional view of a compound semiconductor device.

A method for manufacturing a compound semiconductor device will be described in detail referring to FIG. 34. A graphene layer (omitted in FIG. 9) or a graphene oxide layer (omitted in FIG. 9) is formed on a substrate (omitted in FIG. 9). A compound semiconductor device including a first compound semiconductor layer 310, an active layer 320, and a second compound semiconductor layer 330 may be formed thereon. The first compound semiconductor layer 310 may be provided as an n-type, and the second compound semiconductor layer 330 may be provided as a p-type.

The substrate may be a sapphire single crystalline substrate, without limitation. A wet cleaning may be performed with respect to the substrate to remove impurities on the surface thereof. Then, the first compound semiconductor layer 310 may be formed on the first substrate. For example, the first compound semiconductor layer 310 may be formed by means of a chemical vapor deposition (CVD) method, a molecular beam epitaxy (MBE) method, a sputtering method, a hydroxide vapor phase epitaxy (HVPE) method, and the like. In addition, the first compound semiconductor layer 310 may be formed by injecting a silane gas ($SiH_4$) including n-type impurities such as a trimethyl gallium gas (TMGa), an ammonia gas ($NH_3$), a nitrogen gas ($N_2$) and silicon (Si) into a chamber.

Then, the active layer 320 may be formed on the first compound semiconductor layer 310. The active layer 320 may have a multi quantum well structure having an InGaN/GaN structure by injecting a trimethyl gallium gas (TMGa), an ammonia gas ($NH_3$), a nitrogen gas ($N_2$), and a trimethyl indium gas (TMIn), without limitation.

Then, the second compound semiconductor layer 330 is formed on the active layer 320. For example, the second compound semiconductor layer 330 may be formed by injecting the following into a chamber: biacetyl cyclopentadienyl magnesium ($EtCp_2Mg$){$Mg(C_2H_5C_5H_4)_2$} including p-type impurities such as magnesium (Mg), a trimethyl gallium gas (TMGa), an ammonia gas ($NH_3$), and a nitrogen gas ($N_2$). But it is not limited thereto.

On the second compound semiconductor layer 330, a second electrode layer 340 may be formed. The second electrode layer 340 may include a reflective layer. In this case, the reflective layer may be formed as a metal layer including Al, Ag, or an alloy including Al or Ag. Aluminum or silver may effectively reflect the light generated from the active layer to improve the light extracting efficiency of a light emitting diode.

The substrate is separated to expose the first compound semiconductor layer 310. The separation of the graphene layer or the graphene oxide layer laminated on the first compound semiconductor layer 310 may be performed by using any methods suggested in the fourth example embodiment and the eighth example embodiment. Then, the first electrode layer 305 may be formed on the first compound semiconductor layer 310.

In addition, when a third compound semiconductor layer is further laminated between the first compound semiconductor layer and the substrate, the graphene oxide layer and/or the graphene layer may be interposed at least one position between the substrate and the first compound semiconductor layer, and between the substrate the third compound semiconductor layer. Then, a compound semiconductor device having high quality may be manufactured through one of any methods disclosed in the fourth example embodiment and the eighth example embodiment.

Although embodiments have been described with reference to attached drawings, it should be understood that numerous other modifications and embodiments can be devised by those skilled in the art that will fall within the spirit and scope of the principles of this disclosure. Therefore, all of the embodiments described above are illustrative and are not limited.

INDUSTRIAL APPLICABILITY

According to the example embodiments, the crystalline defects of a semiconductor may be decreased by a graphene oxide layer, and the light emitting efficiency of a semiconductor device may be improved.

According to the example embodiments, a substrate and a compound semiconductor layer may be easily separated by using the properties of graphene while minimizing the adverse effect onto a compound semiconductor, and a compound semiconductor layer having high quality may be manufactured. Based on the advantages, a horizontal-type or a vertical-type light emitting diode having high efficiency may be manufactured.

What is claimed is:

1. A method for manufacturing a compound semiconductor, the method comprising:
    forming a graphene-derived material layer on one of a first substrate and a first compound semiconductor layer;
    forming at least one layer of second compound semiconductor layers on the graphene-derived material layer; and
    transforming the graphene-derived material layer into a graphene oxide layer to separate at least one layer of the second compound semiconductor layers from the first compound semiconductor layer.

2. The method of claim 1, wherein the graphene-derived material layer is a graphene oxide layer.

3. The method of claim 2, wherein the graphene layer is transformed by one method among a chemical treatment method, a heat treatment method and a photo treatment method.

4. The method of claim 3, wherein the graphene oxide layer is transformed into a transformed graphene oxide layer having a greater thickness than the graphene oxide layer by the heat treatment method.

5. The method of claim 3, wherein the graphene oxide layer is reduced by the chemical treatment method and the photo treatment method into a graphene-like layer having a decreased thickness.

6. The method of claim 3, wherein the photo treatment method is conducted by using a transmission depth selection type photo treatment apparatus, light irradiated from the photo treatment apparatus functioning only the graphene oxide layer.

7. The method of claim 1, further comprising:
forming a different graphene-derived material layer under the first compound semiconductor layer; and
forming a second substrate under the different graphene-derived material layer.

8. The method of claim 7, wherein the different graphene-derived material layer is formed so that the first compound semiconductor layer and the second substrate make a contact.

9. The method of claim 7, wherein the graphene-derived material layer or the different graphene-derived material layer is formed on an entire range of an object forming surface.

10. The method of claim 1, wherein the graphene-derived material layer is a graphene layer.

11. The method of claim 10, wherein the graphene layer is transformed into the graphene oxide layer by one method among a chemical treatment method, a heat treatment method and a photo treatment method.

12. The method of claim 1, wherein the graphene-derived material layer includes at least one layer of graphene-derived sheets, the graphene-derived material layer exposing the substrate or the first compound semiconductor layer to the second compound semiconductor layer.

13. The method of claim 12, wherein a layer making a contact with the first compound semiconductor layer among at least one layer of the second compound semiconductor layers has the same properties as the first compound semiconductor layer.

14. The method of claim 1, wherein the at least one layer of the second compound semiconductor layers includes an n-type compound semiconductor layer, an active layer, a p-type compound semiconductor layer and a p-type electrode layer.

15. The method of claim 14, wherein the p-type electrode layer includes a reflective layer.

16. The method of claim 1, wherein a thickness of the graphene oxide layer is greater than that of the graphene layer, and at least one layer of the second compound semiconductor layers being lifted up.

17. The method of claim 1, wherein the separation of one layer among the second semiconductor layers is performed by a sonication treatment.

18. The method of claim 1, wherein an n-type electrode layer is formed at a layer making a contact with the graphene-derived material layer among the at least one layer of the second compound semiconductor layers.

19. The method of claim 1, wherein the at least one layer of second compound semiconductor layers cover an entire region of the graphene-derived material layer.

20. A method for manufacturing a compound semiconductor, comprising:
forming a graphene-derived material layer on a base material;
forming at least one layer of second compound semiconductor layers on the graphene-derived material layer; and
separating at least one layer of the second compound semiconductor layers through an oxidation reaction or a reduction reaction with respect to the grapheme derived material layer.

* * * * *